United States Patent
Drapkin et al.

(10) Patent No.: US 6,642,800 B2
(45) Date of Patent: Nov. 4, 2003

(54) SPURIOUS-FREE FRACTIONAL-N FREQUENCY SYNTHESIZER WITH MULTI-PHASE NETWORK CIRCUIT

(75) Inventors: Oleg Drapkin, Richmond Hill (CA); Chak Cheung Ho, Markham (CA); Ngar Sze Chan, Richmond Hill (CA); Grigori Temkine, Toronto (CA); Ho Ming Wan, Thornhill (CA)

(73) Assignee: ATI Technologies, Inc., Ontario (CA)

( * ) Notice: Subject to any disclaimer, the term of this patent is extended or adjusted under 35 U.S.C. 154(b) by 16 days.

(21) Appl. No.: 10/116,555

(22) Filed: Apr. 4, 2002

(65) Prior Publication Data

US 2003/0189464 A1 Oct. 9, 2003

(51) Int. Cl.[7] .............................. H03L 7/06; H03L 7/07; H03L 7/16

(52) U.S. Cl. .......................... 331/16; 331/1 A; 331/18; 327/156; 327/159

(58) Field of Search ............................ 331/1 A, 2, 16, 331/18, 25, 45, 57; 327/156–159

(56) References Cited

U.S. PATENT DOCUMENTS 6,211,740 B1 * 4/2001 Dai et al. ........................ 331/2
6,346,838 B1 * 2/2002 Hwang et al. ............... 327/156

* cited by examiner

Primary Examiner—David C. Mis
(74) Attorney, Agent, or Firm—Vedder, Price, Kaufman & Kammholz, P.C.

(57) ABSTRACT

A spurious-free fractional-N frequency synthesizer circuit is disclosed. The synthesizer circuit includes a multi-phase network circuit operative to provide output signals that are at least a $1/(2n+1)$ fractional version of the input signal. The synthesizer circuit includes a phase lock loop (PLL) circuit, with the multi-phase network circuit being coupled to the negative feedback loop of the PLL. The multi-phase network circuit includes a smoothing circuit that removes any jitter present at the output of the PLL.

13 Claims, 3 Drawing Sheets

SPURIOUS-FREE FRACTIONAL-N FREQUENCY SYNTHESIZER WITH MULTI-PHASE NETWORK CIRCUIT

FIELD OF THE INVENTION

The present invention generally relates to phase lock loop circuits and, more particularly, to a multi-phase network circuit providing for spurious-free-fractional N frequency synthesis.

BACKGROUND OF THE INVENTION

Phase lock loop (PLL) circuits can be used in a variety of applications including frequency demodulation, frequency multiplication and pulse synchronization, to name just a few. PLLs generally have a structure including a phase detector, a proportional-integrated loop filter, a voltage controlled oscillator (VCO) and an optional amplifier. The phase detector continuously generates an output signal that is proportional to the input phase error between the signals present at its inputs. This error signal is transmitted to the proportional-integrated loop filter to perform a proper phase characteristic of the PLL control loop. The output signal of the loop filter controls the VCO.

The VCO operates to convert the input voltage signal into a time derivative phase signal. As such, the VCO acts as an integrator. Consequently, any jitter or unwanted modulation present in the input signal of the VCO will cause a linearly increasing phase error in the VCO output. High frequency component of the VCO input error directly results in output signal error, which can degrade the operation and/or performance of the PLL or a larger system which incorporates or uses the PLL.

Feed-back dividers are generally included into PLL feed-back loop to control output frequency. In case of integer division ratio of the feed-back divider the PLL output frequency step equals to input reference frequency. In other words, to obtain more fine granularity of the output frequency step fractional divider is used.

There are two popular methods of fractional division implementation. The first method assumes implementation of fractional division as averaging a series of integer division. For example if one wants to divide by 5.5 then one division stage will provide division by 5, and the second division stage will provide division by 6, with the average of such stages resulting in division by 5.5. This method unavoidably produces spurious modulations of the VCO output signal, especially for fine fractional division because in this case fractional division produces low-frequency components which pass proportional-integrated loop filter, and produce unwanted modulation at the VCO output.

The second method is fractional N phase interpolation. In fractional N phase interpolation, the VCO of a PLL generates N output signals, each having a different phase relative to the other output signals. An output signal is a superposition of two signals with adjacent phases having a phase located between those two signals phases. This method, however, still suffers from the aforementioned problems associated with non-attenuation of modulation associated with the interpolation procedure.

In addition to single output applications, PLLs are used to generate a plurality of output signals which, in turn, are used to control a plurality of components within a larger system. In those applications where a PLL is used to create multiple output signals having different frequency values, modulation or other unwanted jitter in the input signal will then propagate throughout the multiple phase generation stages of a larger system, thereby resulting in each of the controlled components operating incorrectly.

Thus, there is a need for an improved phase lock loop which negates the effects of input and output signal modulation or jitter, while at the same time providing fractional or multi-frequency versions of the input signal.

BRIEF DESCRIPTION OF THE DRAWINGS

The present invention and the associated advantages and features provided thereby will be best understood and appreciated upon review of the following detailed description of the invention, taken in conjunction with the following drawings, where like numerals represent like elements, in which.

DETAILED DESCRIPTION OF THE INVENTION

Briefly stated, the present invention is directed to a fractional N frequency synthesizer, employing a multi-phase network circuit, which generates spurious-free fractional versions of an input signal. In an exemplary embodiment, the synthesizer of the present invention comprises a phase lock loop circuit, including an input, an output and a multi-phase network circuit, coupled to the negative feedback loop of the phase lock loop circuit, operative to generate spurious-free fractional versions of the output of the phase lock loop circuit. The multi-phase network circuit includes a smoothing circuit operative to remove the jitter or unwanted modulation from the output of the phase lock loop and provide the resulting signal to the several delay elements present in the multi-phase network circuit. The output of each of the delay elements corresponds to a phase shifted version of the input signal.

Figure 1:
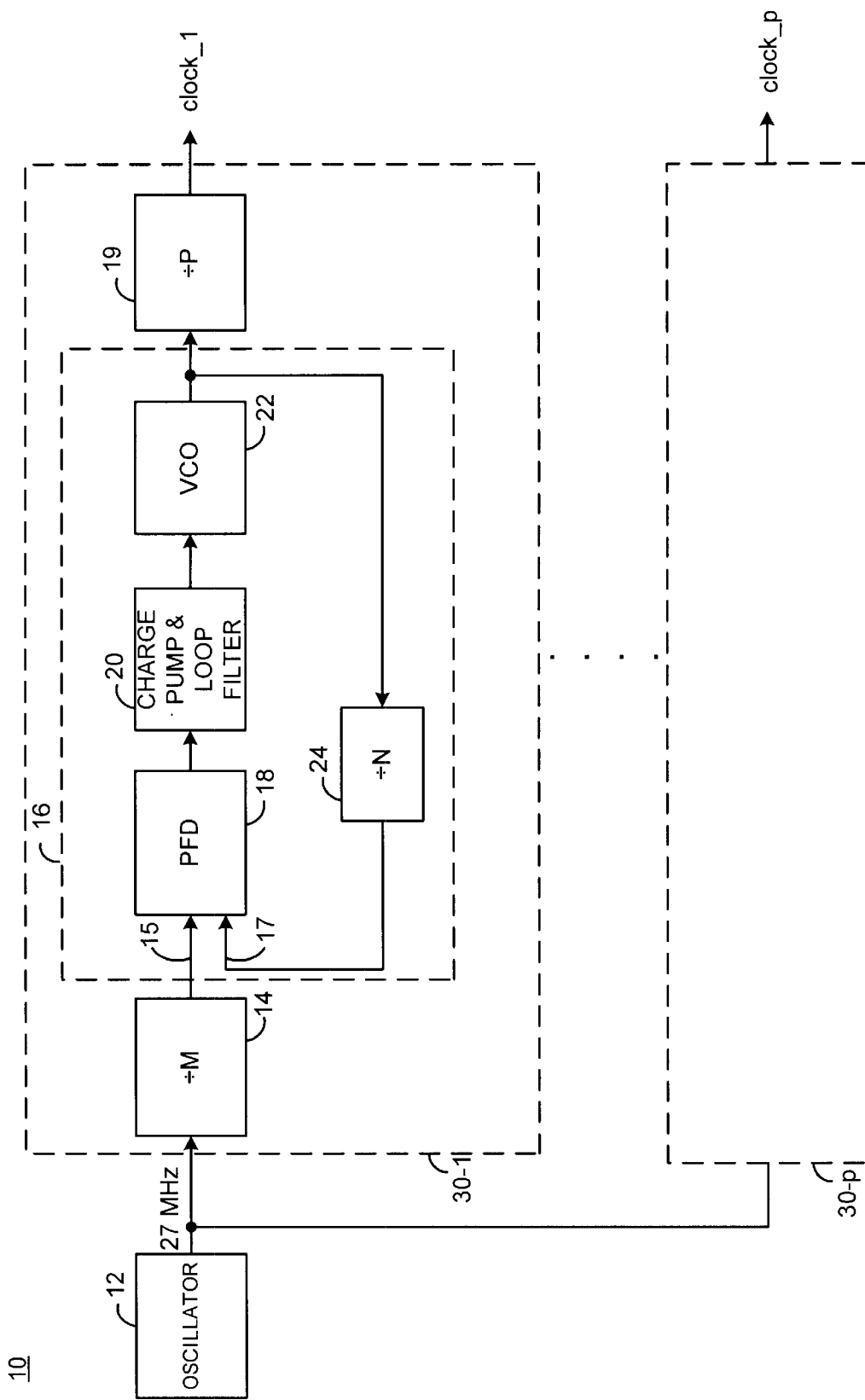
FIG. 1 is a schematic block diagram of a conventional frequency synthesizer circuit.

Referring now to FIG. 1, illustrated therein is a schematic block diagram of a conventional frequency synthesizer circuit 10, which is used to provide an output signal. More specifically, the synthesizer circuit 10 includes a phase lock loop (PLL) 16 which consists of a phase/frequency detection (PFD) block 18, a charge pump and loop filter block 20, a voltage controlled oscillator (VCO) 22 and a fractional N divider block 24, maintained in the feedback loop of the PLL 16. The PFD block 18 receives as inputs a reference signal from a crystal oscillator 12 and the output of the fractional N divider block 24. The PFD block 18 detects any differences in frequency between the signals present at the first input 15 and second input 17, respectively, and transmits an error signal representing the frequency difference to a loop filter 20. Optionally, the reference signal can be provided by an input block 14, which receives the signal from the crystal oscillator 12. The loop filter 20 converts the incoming signal into corresponding control signals which control the VCO 22.

The loop filter 20 includes a charge pump mechanism (not shown) that adjusts the amount of charge that is converted into voltage in corresponding proportion to the magnitude of the error signal. The output of the VCO 22 is provided to the fractional-N divider block 24, where N is a rational number. The fractional-N block divider 24 provides for arbitrary frequency division of the output of the VCO 22, by alternating the value of N between N and N+1 during specified periods to compensate for any frequency averaging performed by the loop filter 20. The output of the fractional-N divider block 24 is applied as the second input 17 of the PFD block 18. The output of the VCO 22 is also provided to an output block 19, which provides the output signal of the PLL 16. The input block 14, PLL 16 and output block 19 comprise a single oscillator block 30 which provides an output signal (e.g. clock_1) that may be used to drive one or more devices (not shown) that are coupled to the oscillator block 30.

In devices or systems requiring more than one control (e.g. clock) signal, with each control signal having a different frequency, each of the oscillator blocks 30 can be used to generate a corresponding output signal. Thus, as shown in FIG. 1, oscillator block 30-1 can be used to provide a first control signal (clock_1) and a subsequent oscillator block 30-p can be used to generate a different control signal (clock_p). In the embodiment shown in FIG. 1, p can be any number greater than one.

In operation, the crystal oscillator 12 provides a signal having a substantially predetermined frequency (e.g. 27 MHz) into the input block 14, which in turn provides a reference signal having a frequency of $f_{osc}/M$ to the first input 15 of the PFD 18. The second input 17 of the PFD 18 is provided by the fractional-N divider block 24. In turn the PFD 18 transmits an error signal to the loop filter 20, representing the difference between the frequency of the reference signal and the frequency of the signal provided by the fractional-N divider block 24. This signal is then transmitted to the loop filter 20, which causes the charge pump element (not shown) of the loop filter 20 to adjust the amount of current that is converted into a voltage, in proportion to the magnitude of the signal provided by the PFD 18, before transmitting the adjusted voltage to the VCO 22. The output of the VCO 22 is provided as an input to both the output block 19 and the fractional-N divider block 24. The output block 19 provides the output (clock-l) signal of the oscillator block 30.

A drawback associated with the synthesizer circuit 10 is that spurious noise or other unwanted signal modulation is caused by the fractional-N divider block 24 due to the periodic switching of N. Thus, spurious signal variations may still be generated and propagate throughout the PLL 16, resulting in erroneous VCO 22 output. This erroneous output will then be provided by the oscillator block 30 to the device(s) that are controlled by the output thereof, resulting in the system in which the oscillator block 30 is incorporated operating incorrectly.

Another drawback associated with the synthesizer circuit 10 is that controlling the output signal frequency ($Nf_{osc}/MP$), where N has a relative value larger than P, such that it remains within specified tolerance ranges (i.e. fine granularity) is difficult. More specifically, to acquire fine granularity of the output signal, the values of M and N may be doubled. However for fine output frequency step achievement, when the value of N is increment by a value of 1, the values of M and P must be made quite large. This causes instability of the circuit as N has a larger value relative to M. Incrementing the operational values of the component blocks results in a corresponding increase of the PLL RC constant. This has the effect of increasing the frequency bandwidth of the output signal relative to the input signal; thereby, reducing the rate of change of the PLL 16 with respect to corresponding changes in the input signal. Thus, during operation of the oscillator block 30, the PLL 16 may not be able to respond quickly enough to any signal modulations caused by the VCO 22, resulting in output signal errors.

Figure 2:
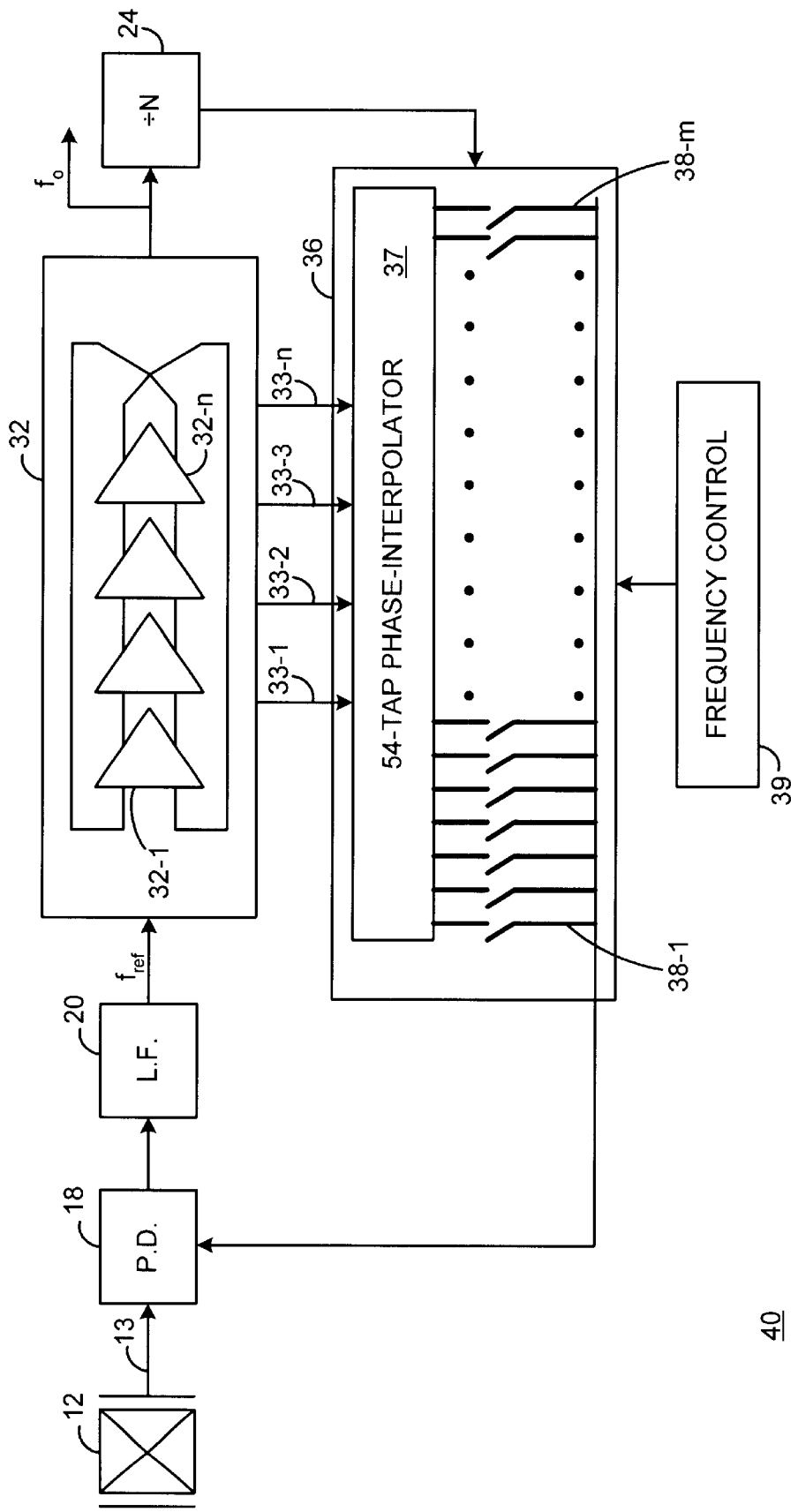
FIG. 2 is a schematic block diagram of a conventional fractional N phase interpolation frequency synthesizer circuit.

FIG. 2 is a schematic block diagram of a conventional fractional-N frequency synthesizer circuit 40, having a phase interpolator block 36 including a plurality of switches or taps (38-1 to 38-m) which may be used to spread out the effects of output signal variation from the VCO 32. A signal having a predetermined frequency is generated by a crystal oscillator (i.e. current source) 12 and transmitted to a phase detector block 18 on line 13. The output of the phase detector block 18 is transmitted to a loop filter 20 which provides the control signal to the VCO 32. The VCO 32 is configured in a multi-tap implementation comprising a series of delay elements 32-1 to 32-n, each providing a corresponding output 33-1 to 33-n which is transmitted to the phase interpolator block 36. The phase interpolator block 36 includes a 54-tap phase interpolator 37 which converts the voltages from the four output VCO 32 into 54 different stages 38-1 to 38-m, which are used to interpolate the multiphase version of the VCO output signal, based on a control signal from block 39.

A drawback associated with the conventional multi-tap synthesizer circuit implementation illustrated in FIG. 2 is that input signal modulation or jitter introduced (for example, from the oscillator 12 or phase detector 18) into the first stage (32-1) of the VCO block 32 propagates through to the last stage 32-n of the VCO block 32, and is then transmitted through the fractional-N divider block 24 into the interpolator block 36. In turn, each of the resulting outputs from the several switches (38-1 to 38-m) will also include propagation error. Therefore, the output signal ($f_0$) of the synthesizer circuit 40 will contain an erroneous (e.g. modulating) value.

In addition, the synthesizer circuit 40 is not capable of generating a nonfactor of two number of phases (output signal phases) from the input signal. Thus, this circuit is limited in the number of fractional output signals that can be generated from the reference signal. Further, the multiple number of output signals that are provided requires the use of a multi-tap VCO 32. Thus, additional space will need to be set aside and accounted for if the synthesizer circuit 40 is to be incorporated into a larger system. Moreover, the aforementioned drawbacks associated with maintaining fine output signal granularity are also present in the multi-tap synthesizer circuit 40 and, in fact, are aggregated due to the use of several VCO 32 taps.

Figure 3:
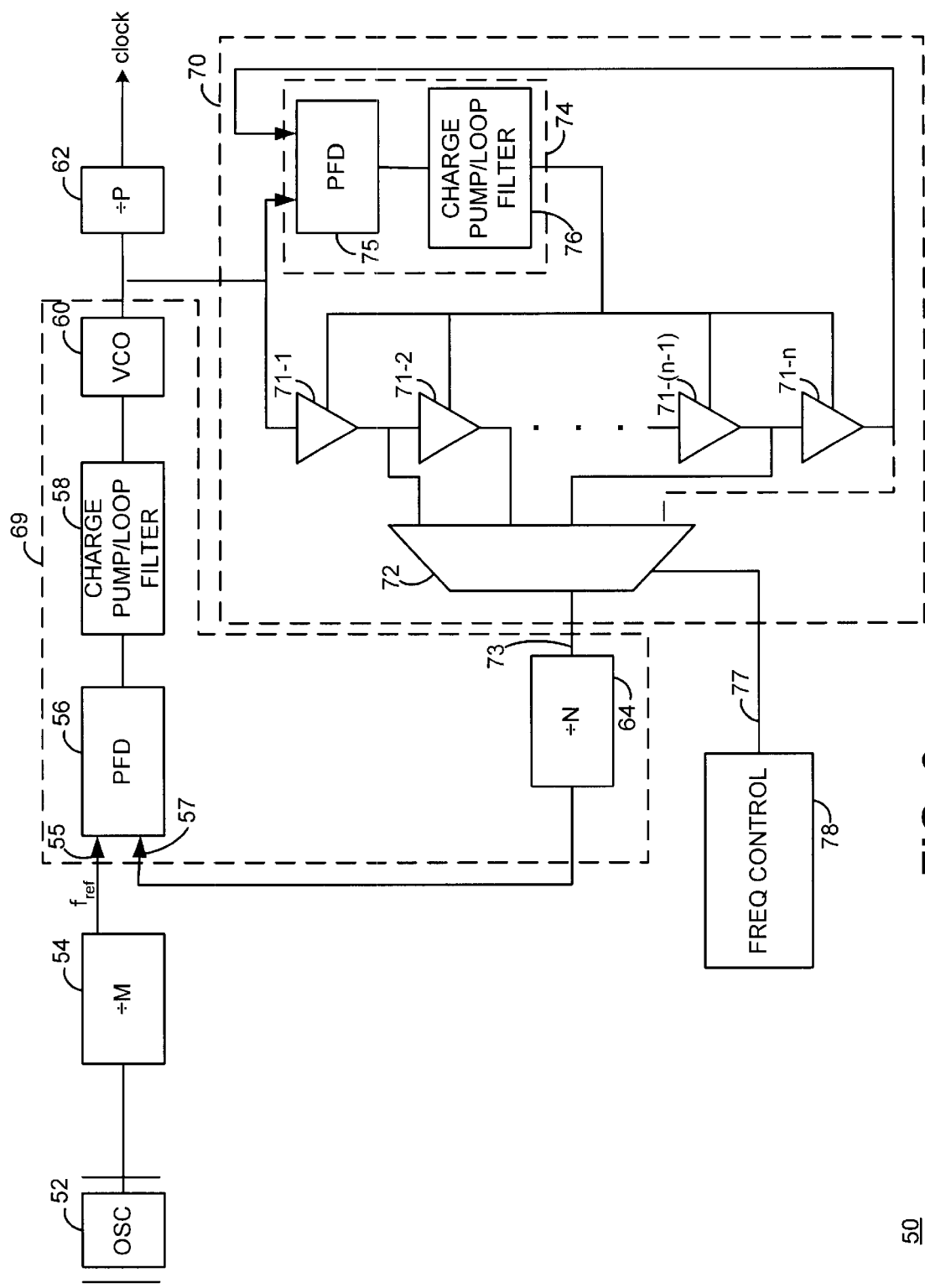
FIG. 3 is a schematic block diagram of the spurious-free fractional N frequency synthesizer circuit according to the present invention.

The aforementioned and related drawbacks associated with conventional PLLs and fractional-N circuits are substantially reduced or eliminated by the multi-phase fractional-N synthesizer circuit of the present invention. Referring now to FIG. 3, the multi-phase fractional-N synthesizer circuit 50 according to the present invention includes a PLL circuit 69 comprised of a first phase/frequency detector (PFD) 56, a loop filter 58, a voltage controlled oscillator (VCO) 60 and a fractional-N division block 64. The output of the VCO 60 is transmitted to an output block 62, which provides the output (clock) signal of the circuit 50 and to a multi-phase network circuit 70 which is coupled to the negative feedback loop of the PLL 69. The multi-phase network circuit 70 of the present invention is configured to provide a plurality of signals that include non one-half fractional $1/(2n+1)$ versions of the input signal, where n is an integer. Additionally, the network circuit 70 attenuates any noise present in the signal provided by the VCO 60 and also regulates the output of the VCO 60 by providing a filtered (i.e. smooth) version of the VCO 60 output signal as the second input of the first PFD 56.

The multi-phase network circuit 70 includes a plurality of delay elements 71-1 to 71-n, each having an output coupled to a corresponding input of a multi-input, single output multiplexer 72 and a smoothing circuit 74. Each delay element 71-x operates to delay the transmission of its associated input signal a fractional (1/(2n+1)) period of time. Thus, each delay element provides a signal having a frequency that is 1/(2n+1) times the frequency of the input signal of each delay element, where n is an integer. Accordingly, the multi-phase network circuit 70 of the present invention is capable of providing multiple output signals, each with a different phase from a single VCO output. This is advantageous as compared to conventional circuits which require multiple VCO outputs to provide multiple phase signals.

The smoothing circuit 74 includes two principal components: a second PFD 75 and a second charge pump/loop filter 76. The first input of the second PFD 75 is coupled to the output of the VCO 60, which comprises the output of the synthesizer circuit 50. The second input of the second PFD 75 is coupled to the output of delay element 71-n. The smoothing circuit 74 removes any variances or other unwanted frequency modulation from the signal at the VCO 60 output and provides a spurious-free substantially constant frequency output signal to each of the delay elements 71-1 to 71-n. In addition, the second PFD 75 aligns the input signal phases in such a fashion that the delay time is delayed by one cycle such that the phase delay is evenly divided by the number of delay elements. In this fashion, fine granularity of the VCO 60 output is maintained; thereby, providing for a spurious-free output (clock) signal. The particular signal output of the multiplexer 72 is controlled through application of a control signal on line 77 generated by frequency control logic 78.

In operation, an initial clock signal having a predetermined frequency is generated by a crystal oscillator (OSC) 52 and is transmitted to a fractional-M input block 54. The input block 54 provides the reference signal ($f_{ref}$) to the first input 55 of the first PFD 56. The first PFD 56 generates an error signal representing the frequency difference between the signals present at it first input 55 ($f_{ref}$) and second input 57, respectively. This error signal, in turn, is transmitted to the loop filter 58. The loop filter includes a charge pump element (not shown) which adjusts the amount of current that is converted into voltage in proportion to the magnitude of the error signal. The voltage is then applied to the VCO 60. The VCO 60 converts the input voltage from the loop filter 58 into a time derivative phase signal. The output voltage of the VCO 60 is provided to the output block 62 and to the multi-phase network circuit 70 of the present invention.

The output of the VCO 60 is provided as one input to the second PFD 75. The second input is coming through delay elements 71-x. The second PFD 75 transmits the signals to the second charge pump and loop filter 76. The second loop filter 76 converts the incoming signal into a voltage having a magnitude proportional to the magnitude of the signal current provided by the second PFD 75. The output of the second loop filter 76 is applied to the control input of each of the delay elements; thereby, resulting in the smoothed PLL output signal being transmitted to the multiplexer 72. As the second PFD 75 latches to the main input frequency, any frequency variations are attenuated and the output voltage of the second loop filter 76 represents a smoothed (e.g. modulation and jitter free) version of the VCO 60 output signal.

Each delay element 71-x provides a time delayed version of the PLL output signal. More specifically, the input of the first delay element 71-1 is coupled to the output of the VCO 60. The output of the first delay element 71-1 is then provided to the input of a second delay element 71-2 and as an input to the multi-input multiplexer 72. The output of the second delay element 71-2 is provided as a second input to the multi-input multiplexer 72 and the input to a third delay element 71-3. The output of the last delay element 71-n is coupled to the last input of the multiplexer 72 and to the second input of the second PFD 75. Each of the delay elements is connected to one another and to the multiplexer 72 as described above. In this fashion, each of the delay elements provides the multiplexer 72 with a spurious-free delayed version of the PLL output signal. Any number n, of delay elements 71-x can be interconnected with one another and to the multi-input multiplexer 72 depending on the particular needs of the application. Thus, the present invention should not be limited to any particular number of delay elements.

The output of the multi-phase network circuit 70 is provided to the fractional-N divider block 64 on line 73 in response to the control signal provided by frequency control block 78 on line 77. The fractional-N divider block 64, as discussed above, compensates for periodic switching oscillations of the signal provided by the VCO 60 before transferring the same to the second input 57 of the first PFD 56. Thus, any remaining jitter not filtered by the multi-phase network circuit 70 is effectively attenuated by block 64. In this fashion, unwanted modulation or jitter is effectively attenuated at both the input and output of the synthesizer circuit 50; thereby, preventing signal errors from propagating through the components of the circuit. Accordingly, fine granularity of the resulting output (clock) signal can be maintained.

Additionally, by providing a smooth multi-phase output signal to the fractional-N divider block 64, the multi-phase synthesizer circuit 50 of the present invention is able to provide multiple fractional versions of the input signal at a single output. This obliviates the need for having multiple components providing an output which corresponds to a different frequency value, which in turn reduces the amount of space and consequently the amount of power that is required to operate the circuit. In space savings resulting from the use of the synthesizer circuit of the present invention will result in an overall reduction in the size of the larger system which employs the synthesizer circuit.

The above detailed description of the present invention and the examples described therein have been presented for the purposes of illustration and description. It is therefore contemplated that the present invention cover any and all modifications, variations or equivalents that fall within the spirit and scope of the basic underlying principles disclosed and claimed herein.

What is claimed is:

1. A frequency synthesizer circuit, comprising:
   a phase lock loop circuit, including an input, an output and a feedback network; and
   a multi-phase delay lock loop circuit, coupled to the feedback network of the phase lock loop circuit, the delay lock loop circuit generating jitter-free fractional versions of the output of the phase lock loop circuit.

2. The circuit of claim 1, wherein the output of the phase lock loop circuit further comprises an oscillator having a single output, and wherein the multi-phase delay lock loop circuit is coupled to the single output of the oscillator.

3. The circuit of claim 2, wherein the delay lock loop circuit further comprises a multiplexer and a plurality of delay elements, each of the delay elements having an input and an output, the output of each of the delay elements being coupled to a respective input of the multiplexer, the outputs of each of the delay elements representing a fractional version of the oscillator output.

4. The circuit of claim 3, wherein the input of the first delay element is coupled to the output of the oscillator, and each succeeding delay element input is coupled to the corresponding output of the preceding delay element.

5. The circuit of claim 3, wherein the delay lock loop circuit further includes a frequency detector and a loop filter, the loop filter having an input and an output, a first input of the frequency detector coupled to the output of the oscillator, the output of the frequency detector coupled to the input of the loop filter, wherein the frequency detector and loop filter operate to filter the oscillator output signal.

6. The circuit of claim 5, wherein the output of the loop filter is coupled to the control inputs of each delay element, wherein the delay elements are provided with a jitter-free control signal.

7. The circuit of claim 3, further including a frequency control circuit operative to control the output frequency of the multiplexer.

8. A frequency synthesizer circuit, comprising:
   an input;
   an output;
   a phase lock loop circuit having a loop input and a loop output, the phase lock loop circuit receiving an input signal at a first loop input, the loop output providing an output signal; and
   a multi-phase network circuit coupled as a negative feedback element of the phase lock loop circuit, operative to provide multiple phase versions of the loop output signal, the multi-phase network including a smoothing circuit operative to combine filtered versions of the loop output signal to each of the multiple phase output signals, the filtered multiple phase output signals being coupled to a second loop input.

9. The circuit of claim 8, wherein the multi-phase network further comprises a multiplexer and a plurality of delay elements, each of the delay elements having an input and an output, the output of each of the delay elements being coupled to a respective input of the multiplexer, the outputs of each of the delay elements representing a fractional version of the input signal.

10. The circuit of claim 9, wherein the smoothing circuit further comprises a frequency detector coupled to the output of the phase lock loop and a loop filter, the loop filter providing a filtered version of the phase lock loop output signal to each of the delay elements.

11. The circuit of claim 9, wherein the output of each of the delay elements has a frequency that is a predetermined fraction of the input signal.

12. The circuit of claim 9, wherein the output of the phase lock loop circuit further comprises an oscillator having a single output, and wherein the multi-phase network is coupled to the oscillator output.

13. The circuit of claim 12, wherein the input of the first delay element is coupled to the oscillator, and each succeeding delay element input is coupled to the corresponding output of the preceding delay element.

* * * * *